United States Patent [19]
Zakhor et al.

[11] Patent Number: 5,164,727
[45] Date of Patent: Nov. 17, 1992

[54] OPTIMAL DECODING METHOD AND APPARATUS FOR DATA ACQUISITION APPLICATIONS OF SIGMA DELTA MODULATORS

[75] Inventors: Avideh Zakhor; Soren Hein, both of Berkeley, Calif.

[73] Assignee: Regents of the Unversity of California, Oakland, Calif.

[21] Appl. No.: 694,294

[22] Filed: Apr. 30, 1991

[51] Int. Cl.$^5$ .............................................. H03M 3/00
[52] U.S. Cl. ..................................... 341/143; 341/138
[58] Field of Search ........................ 341/138, 140, 143

[56] References Cited

U.S. PATENT DOCUMENTS

| | | | |
|---|---|---|---|
| 4,021,799 | 5/1977 | Hinoshita et al. | 341/138 |
| 4,308,524 | 12/1981 | Harrison et al. | 341/143 |
| 4,411,002 | 10/1983 | Auger | 341/138 |
| 4,866,442 | 9/1989 | Steim et al. | 341/143 |
| 4,876,542 | 10/1989 | Van Bavel et al. | 341/143 |
| 5,030,954 | 7/1991 | Riener | 341/172 |

OTHER PUBLICATIONS

S. Hein & A. Zakhor, "Lower Bounds on the MSE of the Single and Double Loop Sigma Delta Modulators", May, 1990.
Chao, Nadeed, Lee and Sodini "A Higher Order Topology for Interpolative Modulators for Oversampling AD Converters", Mar., 1990.
Gray "Oversampled Sigma-Delta Modulation" May, 1987.
Zakhor/Hein "Optimal Decoding for Sigma Delta Modulators", Jun., 1990.
Uchimura, Hayashi, Kirmura & Iwata "Oversampling A-to-D and D-to-A Converters with Multistage Noise Shaping Modulators", Dec., 1988.
Gray "Spectral Analysis of Quantization Noise in a Single-Loop Sigma-Delta Modulator with dc input" Jun., 1989.
Wong & Gray "Two Stage Sigma-Delta Modulation" Nov., 1990.
Chou, Wong & Gray "Multistage Sigma-Delta Modulation" Jul., 1989.
Ferguson, Ganesan & Adams "One Bit Higher Order Sigma-Delta Converters" May, 1990.
Hein & Zakhor "Optimal Decoding for Data Acquisition Applications of Sigma-Delta Modulators" May, 1990.
Youla & Webb "Image Restoration by the Method of Convex Projections: Part 1-Theory" Oct. 1982.

*Primary Examiner*—Marc Hoff
*Attorney, Agent, or Firm*—Heller, Ehrman, White & McAuliffe

[57] ABSTRACT

A class of optimal nonlinear decoding algorithms for data acquisition applications of Sigma Delta modulators is applicable to all current Sigma Delta structures, including single and double loop, cascade and interpolative modulators. The decoding method takes on a particularly simple form for the case of constant modular inputs. While the performance of the present invention is identical to other optimal nonlinear decoding schemes such as table look-up, the present invention is simpler to implement. Numerical results show that the performance of the invention exceed that of conventional linear decoding.

12 Claims, 11 Drawing Sheets

OPTIMAL DECODING METHOD AND APPARATUS FOR DATA ACQUISITION APPLICATIONS OF SIGMA DELTA MODULATORS

This invention was made with Government support under Grant No. MIP-8911017, awarded by the National Science Foundation. The Government has certain rights in this invention.

BACKGROUND OF THE INVENTION

The present invention relates to data acquisition applications and more particularly to an improved method and corresponding apparatus for optimal decoding for data acquisition applications of Sigma Delta modulators.

Sigma Delta ($\Sigma\Delta$) modulators as Analog-to-Digital (A/D) converters have received considerable attention from the signal processing community. Their attraction lies in the trade-off provided between sampling rate and resolution of the in-loop quantizer—specifically, they can achieve the same or higher resolution as multibit quantizers operating at the Nyquist rate by employing a low-resolution quantizer operating at many times the Nyquist rate. In practice, the low-resolution quantizer is usually one-bit because of its ease of implementation and the inherent linearity of two levels.

$\Sigma\Delta$ modulators generally require fewer and simpler components than comparable converters of different types, and are robust against circuit imperfections. Furthermore, they obviate the need for stringent analog anti-aliasing filtering, and relegate the strict processing demands to the digital domain. They are thus attractive for VLSI implementation of relatively low-bandwidth signal processing applications, such as speech and audio.

SUMMARY OF THE INVENTION

It is an object of the present invention to provide an optimal decoding method and corresponding apparatus for data acquisition applications of Sigma Delta modulators.

In one preferred embodiment, the present invention provides a Sigma Delta modulator and method for converting an analog input signal into a digital output signal, based on non-linear digital operations on an internal digital signal.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the description, serve to explain the principles of the invention:

LIST OF FIGURES

1. Discrete-time model of the single loop $\Sigma\Delta$ encoder.
2. Flowchart for the single loop zoomer algorithm.
3. Single loop encoder: SNR as a function of oversampling ratio for the zoomer and the asymptotically optimal FIR filter.
4. Discrete-time model of the double loop $\Sigma\Delta$ encoder.
5. Flowchart for the double loop zoomer algorithm.
6. Double loop encoder: SNR as a function of oversampling ratio for the zoomer and the sinc$^3$ filter.
7. Discrete-time model of the two stage $\Sigma\Delta$ encoder.
8. Flowchart for the two stage zoomer algorithm.
9. Two stage encoder: SNR as a function of oversampling ratio for the zoomer and the sinc$^3$ filter.
10. Dicrete-time model of the interpolative $\Sigma\Delta$ encoder.
11. Flowchart for POCS technique. The time-domain and frequency-domain projections $P_1$ and $P_2$ are described in the text.

LIST OF TABLES

1 Comparison of zoomer and linear for the ideal single loop, double loop and two stage modulators.
2 Sensitivity of the zoomer to various non-idealities. Quantities given in percent are measured relative to the quantizer to step size b. Quantities given for the leak are the minimum op-amp gains necessary.

DETAILED DESCRIPTION OF THE PREFERRED EMBODIMENTS

Reference will now be made in detail to the preferred embodiments of the invention examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The present invention is directed toward the use of $\Sigma\Delta$ modulators for data acquisition applications. For a given $\Sigma\Delta$ modulator, referred to as an encoder, which converts a low-rate analog signal into a high-rate digital binary signal, the invention provides a method of decoding the encoded digital binary signal into a low-rate digital approximation to the analog signal. The invention accepts as input this high-rate binary signal, N bits at a time, and generates a digital signal which closely approximates the analog signal. In this respect, the invention is similar to conventional decoders which consist of linear low-pass filters. However, the invention is different from linear filtering in that it requires nonlinear operations to arrive at the optimal estimate. The invention offers substantial gains in Signal-to-Noise Ratio (SNR) performance over linear decoding. In the case of constant inputs, the invention uses two registers to maintain bounds on the estimated constant input. In the case of time-varying inputs, the invention makes use of the mathematical theory of Projections onto Convex Sets (POCS). The particular set-up considered for a conversion cycle of a given $\Sigma\Delta$ modulator is the following: The initial states of all internal modulator delay elements are set to zero, and the encoder is run for N clock cycles. The resulting N-bit output sequence is fed to a decoder whose task is to estimate the input. The function of the invention is explained separately for constant inputs in section 1, and for time-varying inputs in section 2.

1 OPTIMAL DECODING FOR CONSTANT INPUTS

One can view a $\Sigma\Delta$ encoder with constant inputs as a source coder or non-uniform quantizer which divides its dynamic range into intervals separated by transition points, with each interval corresponding to a distinct N-bit output sequence [6,7]. The optimal performance in terms of maximizing the SNR is achieved by a decoder that takes a codeword as its input, and outputs the midpoint of the corresponding interval. Such a decoder is nonlinear and exploits the specific bit patterns to arrive at optimal estimates of the input. The optimal decoder could in principle be implemented using a table in the form of a Programmable Logic Array (PLA). In practice this is not feasible, as the table would be prohibitively large. This invention presents a general technique, called zooming, for optimal decoding of constant inputs. The encoder structures we explicitly consider include the single loop, double loop, two stage noise-shaping (MASH) and interpolative encoders.

1.1 Single Loop Modulator

Figure 1:
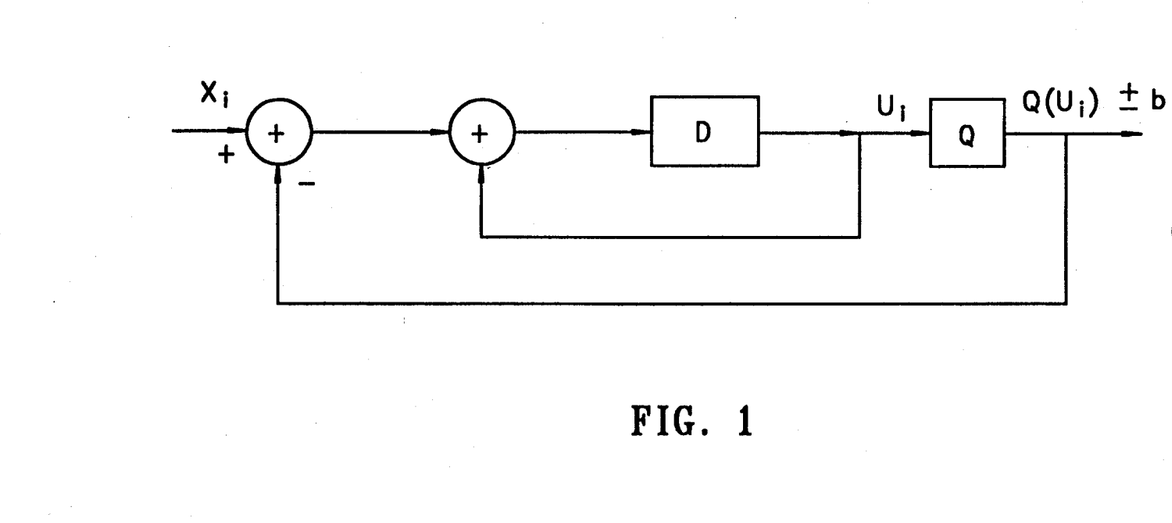

FIG. 1 shows the discrete-time model of the single loop $\Sigma\Delta$ encoder which consists of two adders, a delay element D and a one-bit quantizer Q whose function is given by $$Q(U) = \begin{cases} -b \text{ if } U \leq 0 \\ +b \text{ if } U > 0 \end{cases} \quad (1)$$

where b is a constant, and U is the quantizer input. The system shown in FIG. 1 satisfies the following difference equation in terms of the state variable $U_i$:

$$U_i = U_{i-1} + X_{i-1} - Q(U_{i-1}), \ i \geq 1$$

Assuming that the initial state is $U_0=0$, the state at time n is given by $$U_n = \sum_{i=0}^{n-1} [X_i - Q(U_i)] = \left(\sum_{i=0}^{n-1} X_i\right) - S_n, \ n \geq 1 \quad (2)$$

where $S_n$ is the running sum of output bits given by $$S_n = \sum_{i=0}^{n-1} Q(U_i), \ n \geq 1$$

Assuming constant input, $X_i = X$ for $i \geq 0$, the first sum in (2) equals nX, and for any given codeword, $S_n$ can be found by summation of the known output sequence. With the definition $S_0=0$, we have the recursive relationship $$S_n = S_{n-1} + Q(U_{n-1}), \ n \geq 1$$

The only information available to the decoder is the N-bit encoder output sequence, $\{Q(U_n), 0 \leq n \leq N-1\}$, or equivalently, the signs of the quantizer input sequence. Taking (2) into account, this information determines whether the sum of inputs is greater or less than the sum of outputs at each time n. For each n we can thus derive a bound on the input:

$$X > \overline{X}_n \text{ if } Q(U_n) = +b; \ X \leq \overline{X}_n \text{ if } Q(U_n) = -b \quad (3)$$

where $\overline{X}_n$ is the running average given by $$\overline{X}_n = \frac{1}{n} S_n \quad (4)$$

Figure 2:
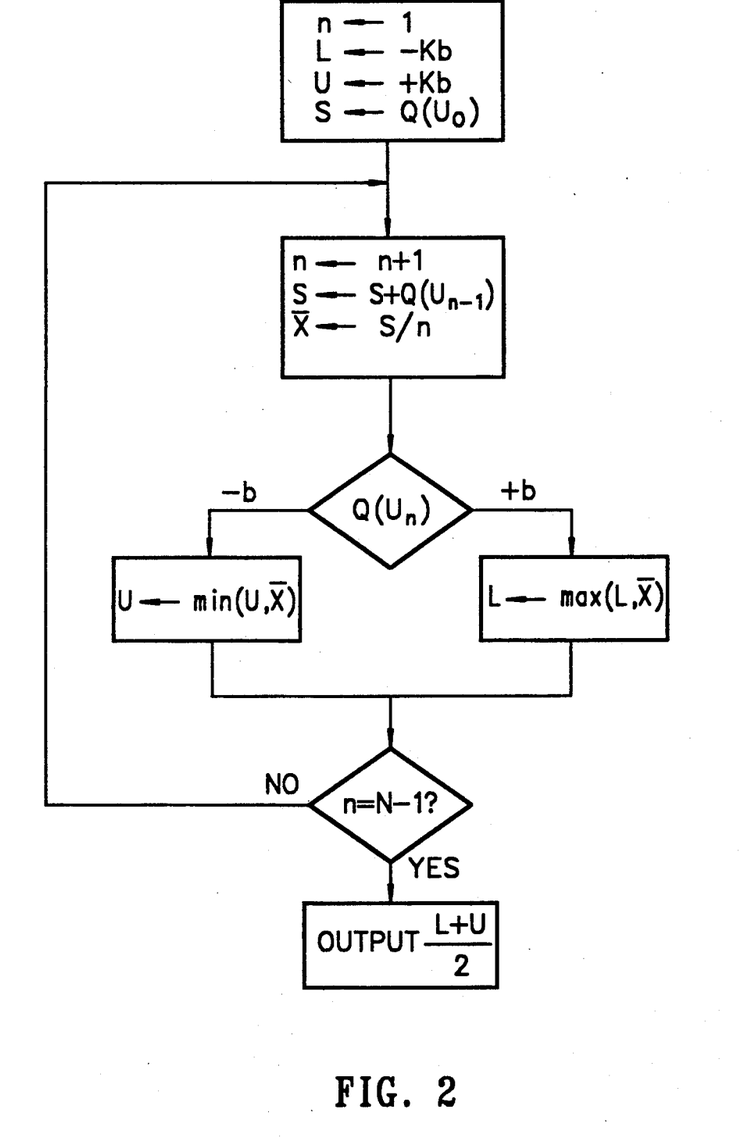

For each $2 \leq n \leq N-1$, equation (3) gives a lower or upper bound on X, depending on the known quantity $Q(U_n)$. Because there are only a finite number of codewords for inputs in the dynamic range, each codeword can be generated by a specific range of inputs. The zoomer is the decoder that uses the succession of lower and upper bounds from (3) to arrive at the sharpest possible lower and upper bounds on the input resulting in a specific codeword. FIG. 2 shows a flowchart of the zoomer algorithm; it consists of an initialization phase, and a loop containing an update of running sums and an update of either the lower or the upper bound. The algorithm uses lower and upper bound registers L and U initialized to the endpoints of the dynamic range. Letting n run from 2 to $N-1$, the zoomer maintains the greatest lower bound and the least upper bound in the registers; at each time step, the new bound is compared with previous bounds, and the appropriate bound register updated accordingly. The algorithm extracts all information from the codeword, and results in an optimal decoding procedure. After processing all the N bits from the encoder, the decoder outputs (L+U)/2 as its estimate of the input. From the above, any codeword will result in compatible bounds, that is, $L \leq U$. Conversely, it can be shown that all non-codewords will result in incompatible bounds [9]. The zoomer is mostly linear, but the conditional register updating is nonlinear.

We can compare the SNR performance of the zoomer with that of linear filtering. The SNR is defined in [7]. The asymptotically optimal linear N-tap Finite Impulse Response (FIR) decoder for constant inputs was derived by Gray [10] and has tap coefficients $$h_n = 6 \frac{(n+1)(N-n)}{N(N+1)(N+2)}, \ 0 \leq n \leq N-1 \quad (5)$$

Figure 3:
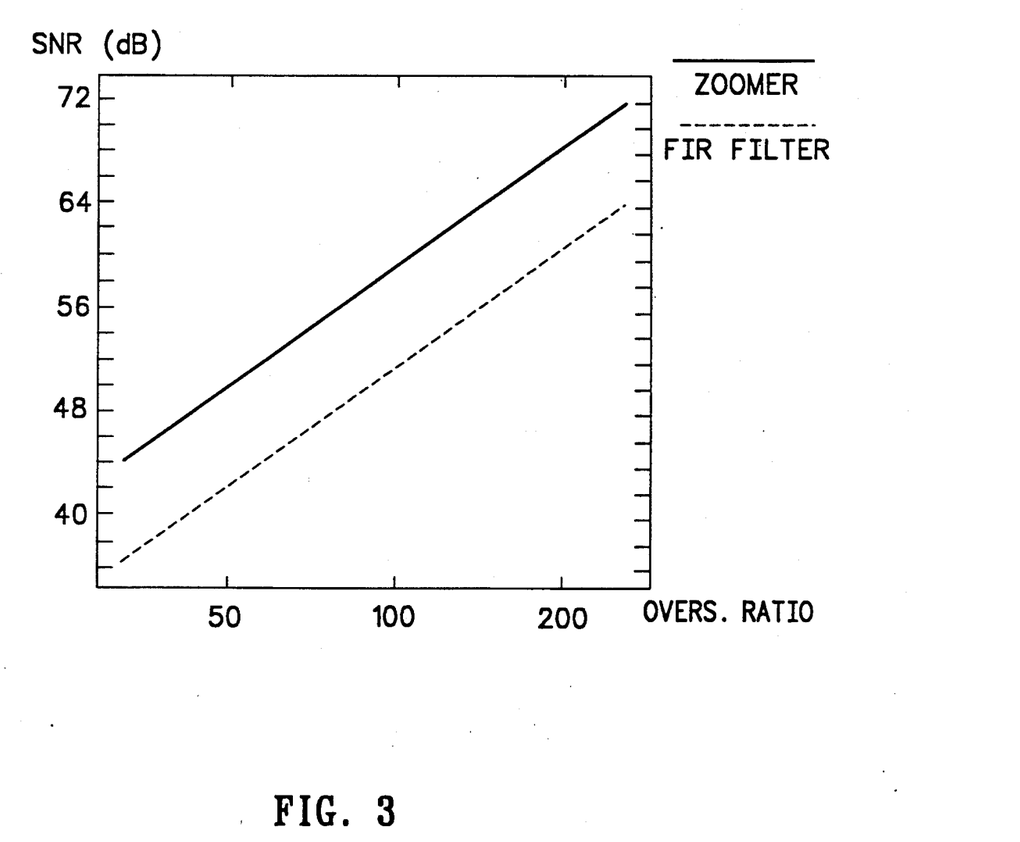

N is referred to as the OverSampling Ratio (OSR) for constant inputs. FIG. 3 shows that for a given OSR, the zoomer gains about 8 dB or 1½ bits of SNR over the FIR filter. Alternatively, the zoomer requires half the oversampling ratio of the FIR filter to obtain the same performance, resulting in shorter data acquisition times. Both SNR curves have a slope of 9 dB/octave.

1.2 Double loop modulator

Figure 4:
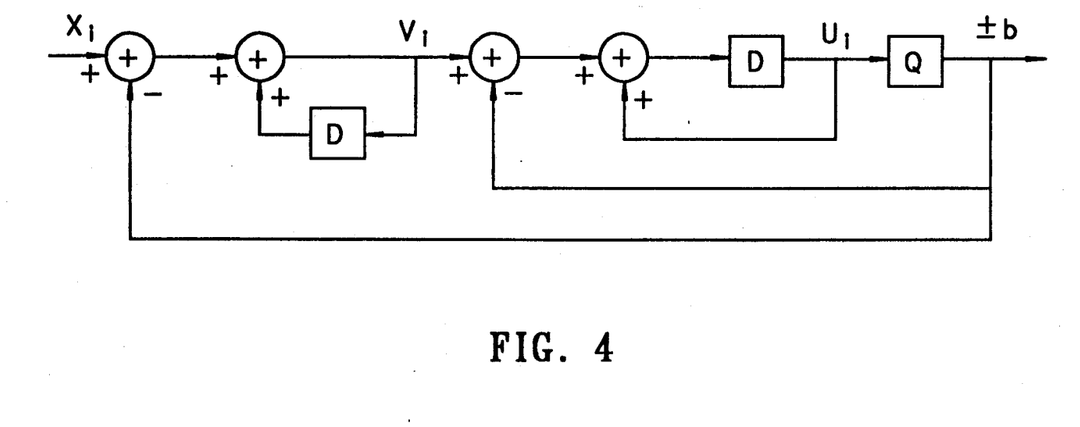

FIG. 4 shows the discrete-time model of the double loop $\Sigma\Delta$ encoder. The encoder contains two cascaded discrete integrators, and the quantizer output is fed back to the input as well as to an intermediate node. The difference equations for the system are $$U_n = U_{n-1} + V_{n-1} - Q(U_{n-1})$$

$$V_n = V_{n-1} + X_n - Q(U_n), \ n \geq 1$$

where $U_n$ and $V_n$ are the two integrator state variables. Assuming zero initial states, $U_0=V_0=0$, and constant input, $X_n=X$, the equation for $V_n$ implies $$\sum_{i=0}^{n-1} V_i = \tfrac{1}{2}n(n-1)X - \sum_{i=1}^{n-1}(n-i)Q(U_i)$$

and the equation of $U_n$ implies $$U_n = \sum_{i=0}^{n-1} V_i - \sum_{i=0}^{n-1} Q(U_i) \quad (6)$$

$$= \tfrac{1}{2}n(n-1)X - Q(U_0) - \sum_{i=1}^{n-1}(n-i+1)Q(U_i),$$

$$n \geq 2$$

To facilitate the calculation of the sum involving quantizer outputs, we define the running sums $$S_n = \sum_{i=1}^{n-1} Q(U_i), \quad n \geq 2 \quad (7)$$

$$W_n = \sum_{i=1}^{n-1}(n-i+1)Q(U_i), \quad n \geq 2 \quad (8)$$

Defining $S_1 = W_1 \triangleq 0$, we then have the recursions $$S_n = S_{n-1} + Q(U_{n-1}), \; n \geq 2 \quad (9)$$

$$W_n = W_{n-1} + S_n + Q(U_{n-1}), \; n \geq 2 \quad (10)$$

The information available to the decoder is $\{Q(U_n), 0 \leq n \leq N-1)\}$. From the difference equations we have $U_1 = +b > 0$, $V_1 = X - b$ and $U_2 = X - b < 0$, so the first three output bits are always $Q(U_0) = -b$, $Q(U_1) = +b$ and $Q(U_2) = -b$ regardless of the input, and the first informative bit is $Q(U_3)$. As in the single loop case, we can use (6) to obtain a bound on the input at each time $3 \leq n \leq N-1$: We obtain a lower or an upper bound depending on whether $Q(U_n) = +b$ or $-b$. Specifically, $$X > \overline{X}_n \text{ if } Q(U_n) = +b; \; X \leq \overline{X}_n \text{ if } Q(U_n) = -b$$

where $\overline{X}_n$ is given by $$X_n = \frac{Q(U_0) + W_n}{\tfrac{1}{2}n(n-1)}, \quad n \geq 3 \quad (11)$$

Figure 5:
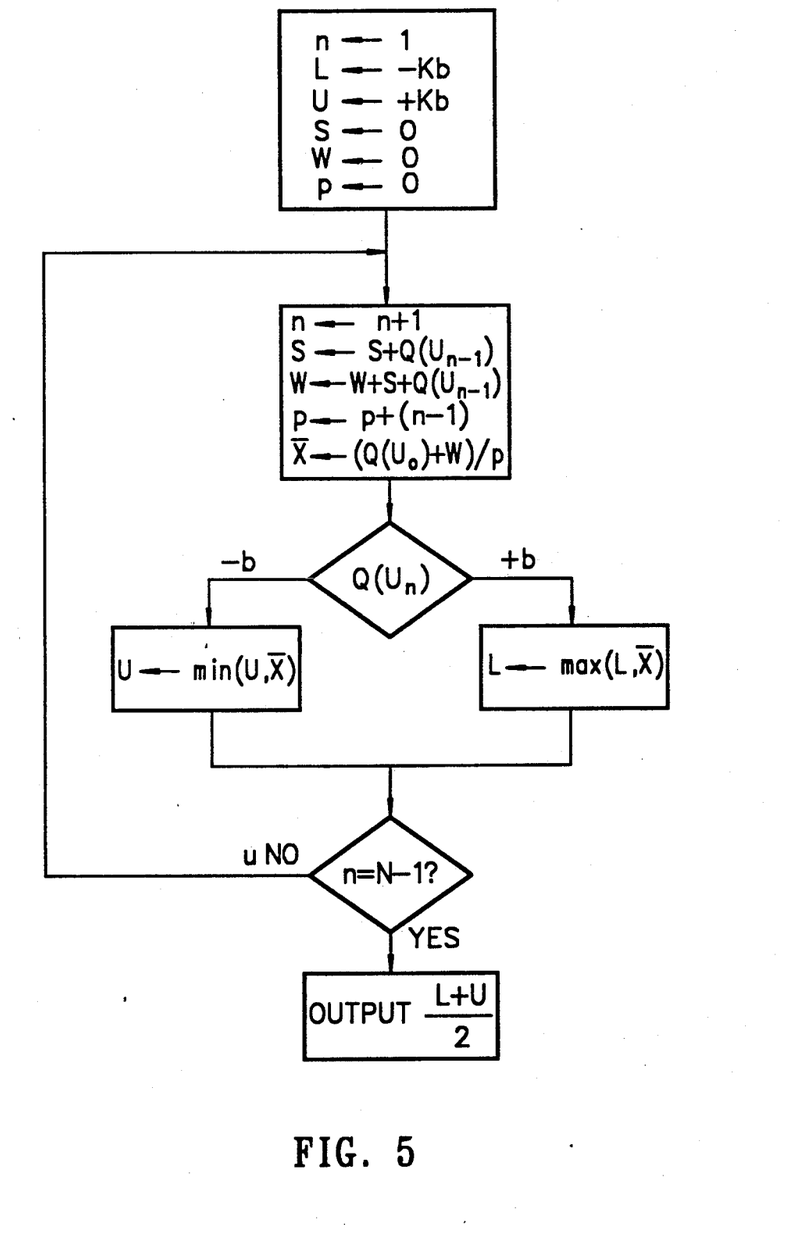

Each codeword is generated by a specific range of input values. Analogous to the single loop zoomer, the double loop zoomer is the decoder that uses the output sequence to derive a succession of lower and upper bounds on the input; the sharpest to these bounds are the best possible bounds on the input resulting in the output sequence. This is achieved by using the lower and upper bound registers L and U, initialized to the endpoints of the dynamic range. Letting n range from 3 to N−1, the zoomer maintains the greatest lower bound and the least upper bound in the registers. FIG. 5 show a flowchart of the double loop zoomer algorithm. The variables S and W correspond to the quantities given by (9) and (10), respectively, and p is the denominator in the bound fraction (11).

Figure 6:
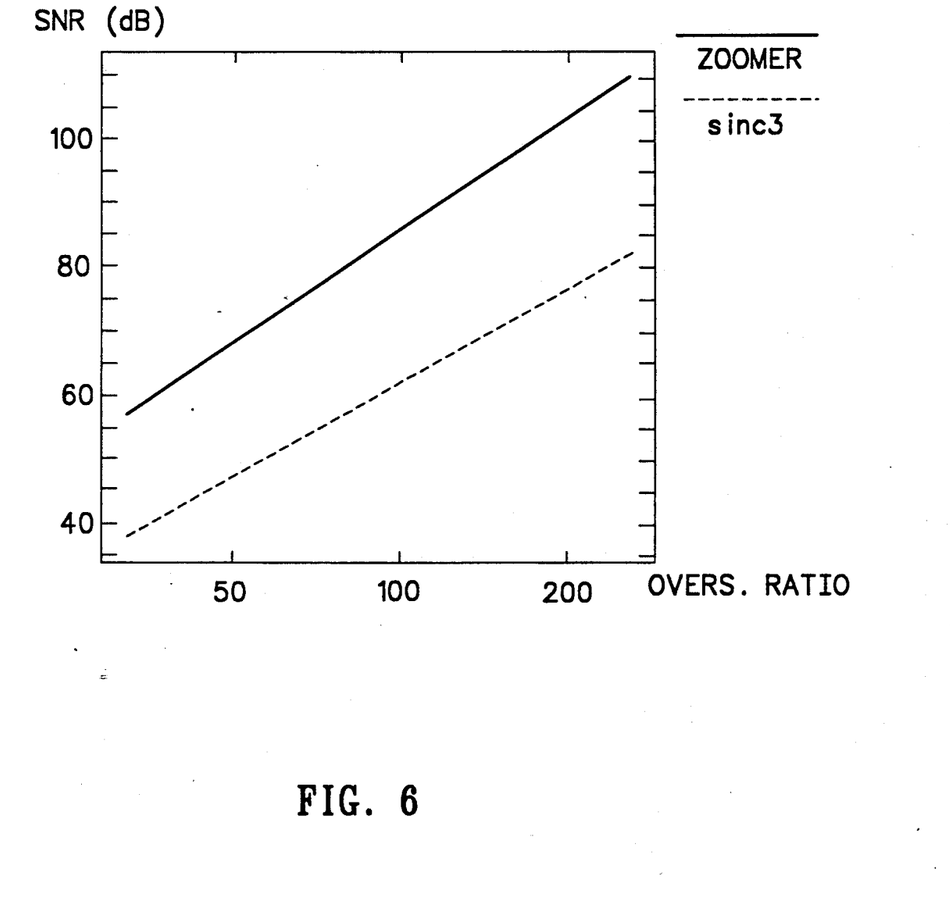

We can compare the SNR performance of the double loop zoomer with that of linear filtering. The linear decoder under consideration here is the N-tap filter with as sinc³ transfer function which is believed to be close to optimal [5]. FIG. 6 shows that at a given OSR, the zoomer is superior to the sinc³ filter by between 20 and 30 dB of SNR. The SNR achieved by the sinc³ filter at an oversampling ratio of 256 is reached by the zoomer at an OSR of approximately 100. This translates into shorter data acquisition times. For the zoomer, the slope of the SNR curves is about 17 dB/octave, whereas for the linear filter, the slope is 14.7 dB/octave.

The zoomer thus achieves a better trade-off with oversampling ratio than the linear filter.

1.3 Two stage modulator

Figure 7:
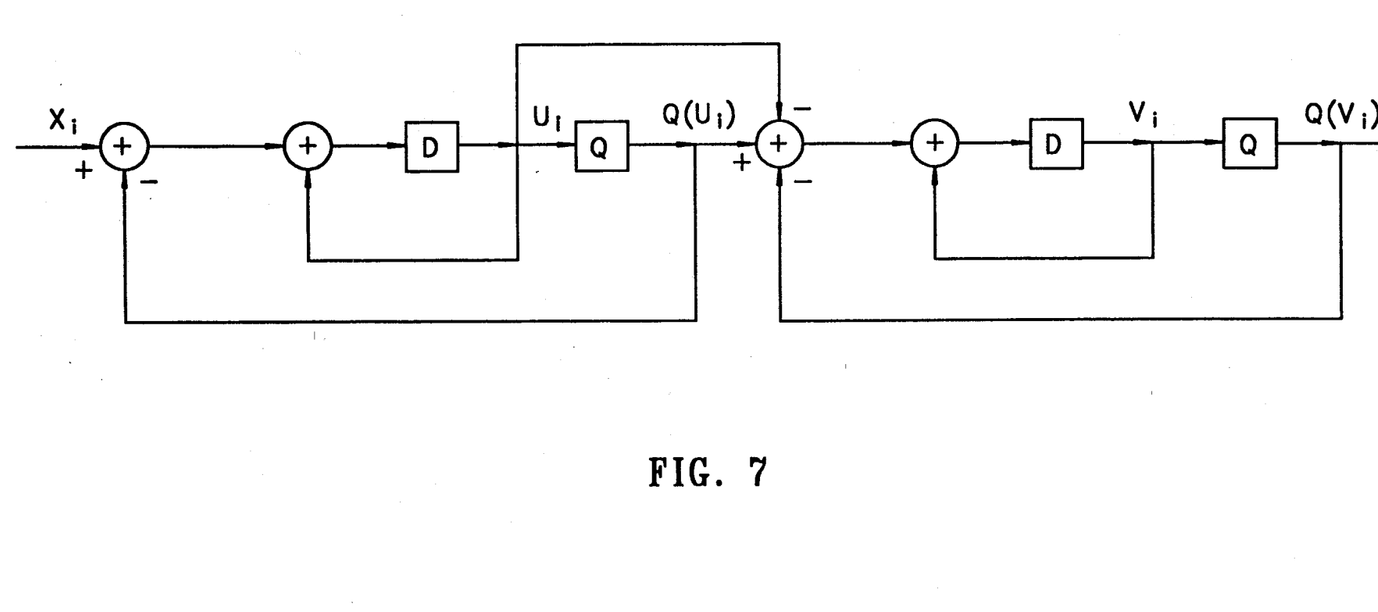

FIG. 7 shows the discrete-time model of the two stage MASH encoder [12]. The encoder consists of two single loop stages, of which the first is fed with the input, and the second is fed with the quantization error sequence of the first stage. The original papers on this cascade structure also include a noise cancelling circuit that performs noise shaping and combines the two binary output streams into one quaternary sequence [12], [11]. This has the effect of eliminating the direct appearance of the first stage quantization error in the output sequence. Although this is a desirable characteristic, the circuit might in general be discarding information present in the separate stage outputs. We will adopt the viewpoint that the noise cancelling circuit is part of a decoder, and the decoder should not be limited to operating on the sequence obtained by irreversibly combining the two output sequences into one. We will therefore use $\{Q(U_i)\}$ and $\{Q(V_i)\}$ directly for decoding.

The difference equations governing the state variables $U_n$ and $V_n$ for the two stage encoder shown in FIG. 7 are $$U_n = U_{n-1} + X_{n-1} - Q(U_{n-1})$$

$$V_n = V_{n-1} - U_{n-1} + Q(U_{n-1}) - Q(V_{n-1}), \; n \geq 1$$

Assuming that the initial stages are $U_0 = V_0 = 0$, these can be solved to yield $$U_n = \sum_{i=0}^{n-1} X_i - \sum_{i=0}^{n-1} Q(U_i), \quad n \geq 1 \quad (12)$$

$$V_n = -\sum_{i=0}^{n-2}(n-1-i)X_i + \sum_{i=0}^{n-1}(n-i)Q(U_i) - \sum_{i=0}^{n-1} Q(V_i), \quad (13)$$

$$n \geq 2$$

Let us define the running sums $$S_n = \sum_{i=0}^{n-1} Q(U_i), \quad n \geq 1 \quad (14)$$

$$T_n = \sum_{i=0}^{n-1} Q(V_i), \quad n \geq 1 \quad (15)$$

$$W_n = \sum_{i=0}^{n-1}(n-i)Q(U_i), \quad n \geq 1 \quad (16)$$

Defining $S_0 = T_0 = W_0 0$ we then have the recursions $$S_n = S_{n-1} + Q(U_{n-1}), \; n \geq 1$$
$$T_n = T_{n-1} + Q(V_{n-1}), \; n \geq 1$$
$$W_n = W_{n-1} + S_n, \; n \geq 1$$

We assume that the input is constant, $X_i = X$ for $i \geq 0$. At time n, (12) and (13) each provide potential new bounds on this input: The new bound is an upper or a lower bound depending on whether $Q(U_n) = -b$ or $+b$. Specifically, (12) results in $$X > X^{(1)}_n \text{ if } Q(U_n) = +b; \; X \leq X^{(1)}_n \text{ if } Q(U_n) = -b; \quad (17)$$
$$n \geq 1$$

where $\overline{X}_n^{(1)}$ is the running average $$X_n^{(1)} = \frac{1}{n} S_n \qquad (18)$$

Equation (13) results in an upper or lower bound on the input, depending on whether $Q(V_n)$ is positive or negative. Specifically, $$X < X_n^{(2)} \text{ if } Q(V_n) = +b; \ X \geq X_n^{(2)} \text{ if } Q(V_n) = -b; \quad n \geq 2 \qquad (19)$$

where $$X_n^{(2)} = \frac{W_n - T_n}{\frac{1}{2}n(n-1)} \qquad (20)$$

Figure 8:
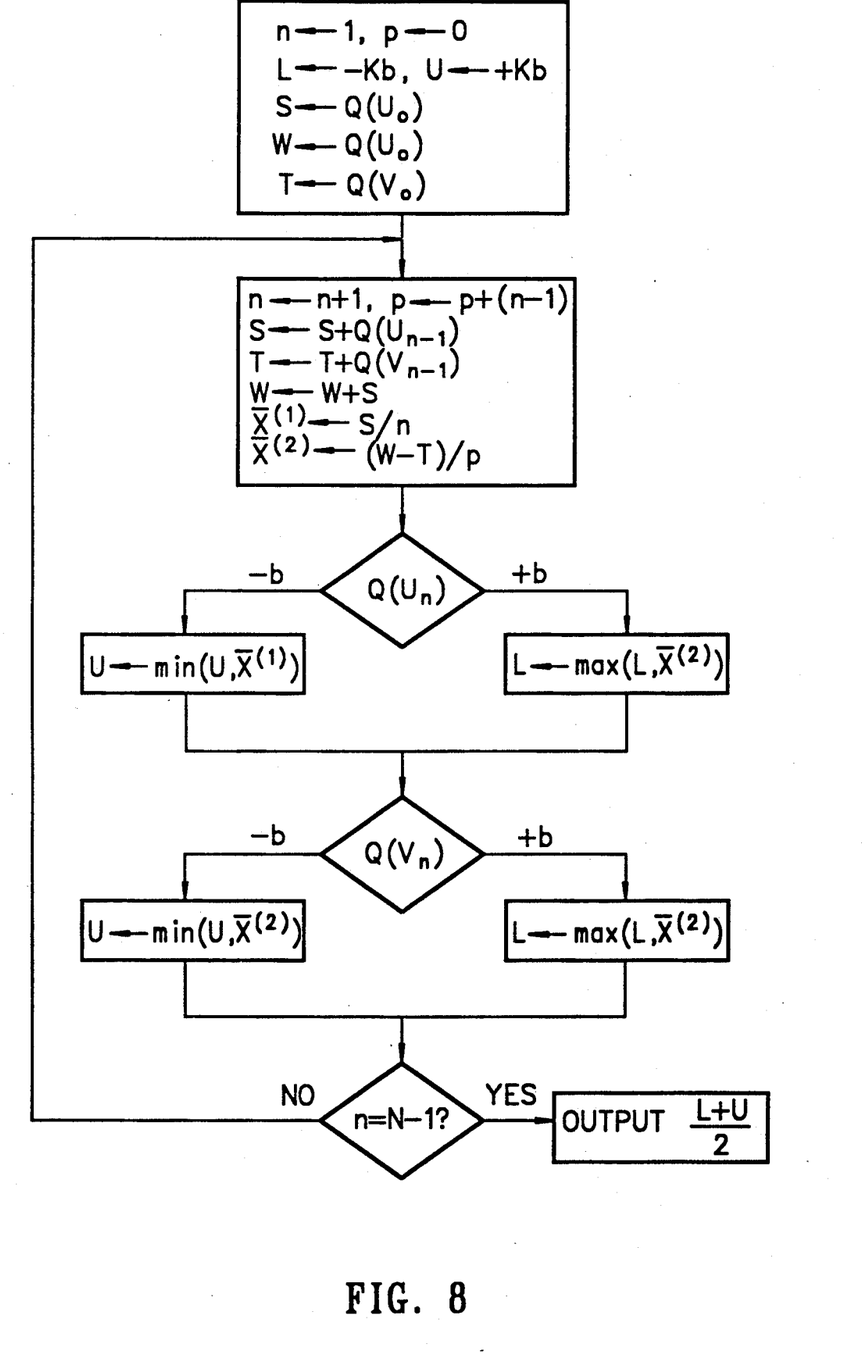

FIG. 8 shows a flowchart for the two stage zoomer algorithm; the two stage zoomer uses the succession of lower and upper bounds from both (17) and (19) to arrive at overall lower and upper bounds on the input resulting in a specific codeword. This is achieved by using lower and upper bound registers L and U, initialized to the endpoints of the dynamic range. Letting n range from 3 to $N-1$, the zoomer maintains the greatest lower bound and the least upper bound in the registers. Variables S, T, and W in FIG. 9 hold the sums in (14), (15) and (16), respectively, and p is the denominator of (20), while $\overline{X}^{(1)}$ and $\overline{X}^{(2)}$ correspond to the quantities (18) and (20). At each time step, the flowchart contains two conditional updates of the bound registers, corresponding to equations (18) and (20).

Figure 9:
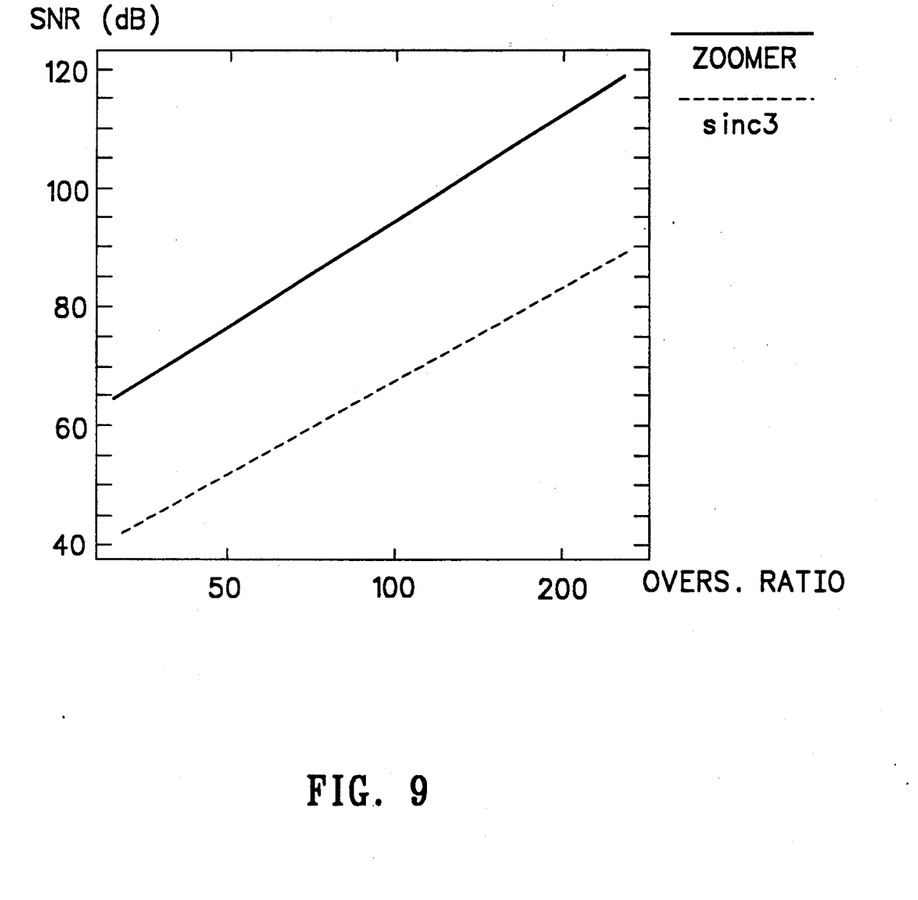

We can compare the SNR performance of the two stage zoomer with that of linear filtering. The linear filter we consider is the N-tap filter with a $\text{sinc}^3$ transfer function which is believed to be close to optimal [11]. FIG. 9 shows that a given OSR, the zoomer achieves 20-30 dB higher SNR than the linear filter. For the depicted range of oversampling ratios, this translates into a reduction by a factor of 2-3 in data acquisition times to achieve a given performance. For the zoomer, the slope of the SNR curve is about 18 dB/octave, whereas for the linear filter, the slope is 14.7 dB/octave. The zoomer thus achieves a more favorable trade-off between SNR and oversampling ratio than the linear filter.

1.4 Interpolative modulators

Figure 10:
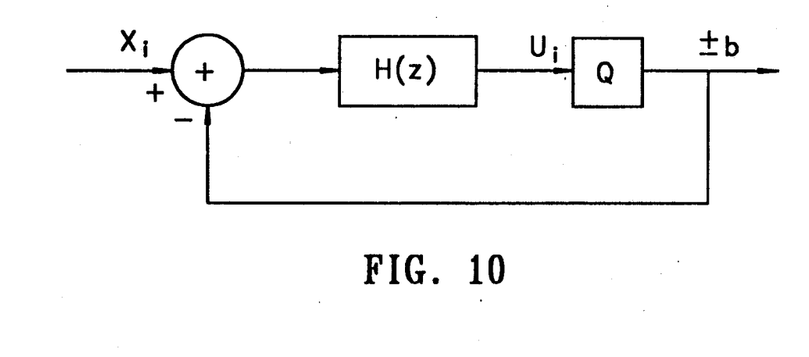

The general interpolative encoder structure is shown in FIG. 10. It is characterized by the transfer function H(z) which is chosen to be low-pass. We will demonstrate the applicability of the zoomer concept to interpolative encoders. We denote the impulse response of H(z) by $\{h_0, h_1, h_2, \ldots\}$. To avoid race-around we must have $h_0 = 0$. Under the constant input assumption, the state variable U at time n is given by $$U_n = \sum_{i=0}^{n} h_{n-i}[X_i - Q(U_i)] = X\left(\sum_{i=0}^{n-1} h_{n-i}\right) - \sum_{i=0}^{n-1} h_{n-i}Q(U_i), \ n \geq 0$$

The zoomer algorithm uses the output bits to derive a succession of upper and lower bounds on the input. The bound at a time n is a lower or an upper bound for $Q(U_n) = +b$ and $-b$, respectively. Specifically, $$X > \overline{X}_n \text{ if } Q(U_n) = +b; \ X \leq \overline{X}_n \text{ if } Q(U_n) = -b$$

where $\overline{X}_n$ is given by $$X_n = \frac{\sum_{i=0}^{n-1} h_{n-i} Q(U_i)}{\sum_{i=1}^{n} h_n}$$

As an example, the single loop encoder can be viewed as an interpolative encoder with $H(z) = z^{-1}/(1-z^{-1})$. Therefore, $\{h_0, h_1, h_2, \ldots\} = \{0, 1, 1, \ldots\}$ and $$X_n = \frac{1}{n} \sum_{i=0}^{n-1} Q(U_i)$$

in agreement with (4). The above technique generalizes to the case where the transfer function from input to quantizer input is different from the transfer function from quantizer output to quantizer input. This would be the case if there was also a filter in the feedback path from quantizer input to input summing node; see for example [14].

2 OPTIMAL DECODING FOR TIME-VARYING INPUTS

We consider the case of a general interpolative $\Sigma\Delta$ encoder as shown in FIG. 10, with time-varying rather than constant N-sample input sequences. Given an N-bit digital modulator output sequence, the invention provides a nonlinear decoding technique for estimating the N-sample analog input sequence. The algorithm is based upon the general technique of Projections Onto Convex Sets [10].

Figure 11:
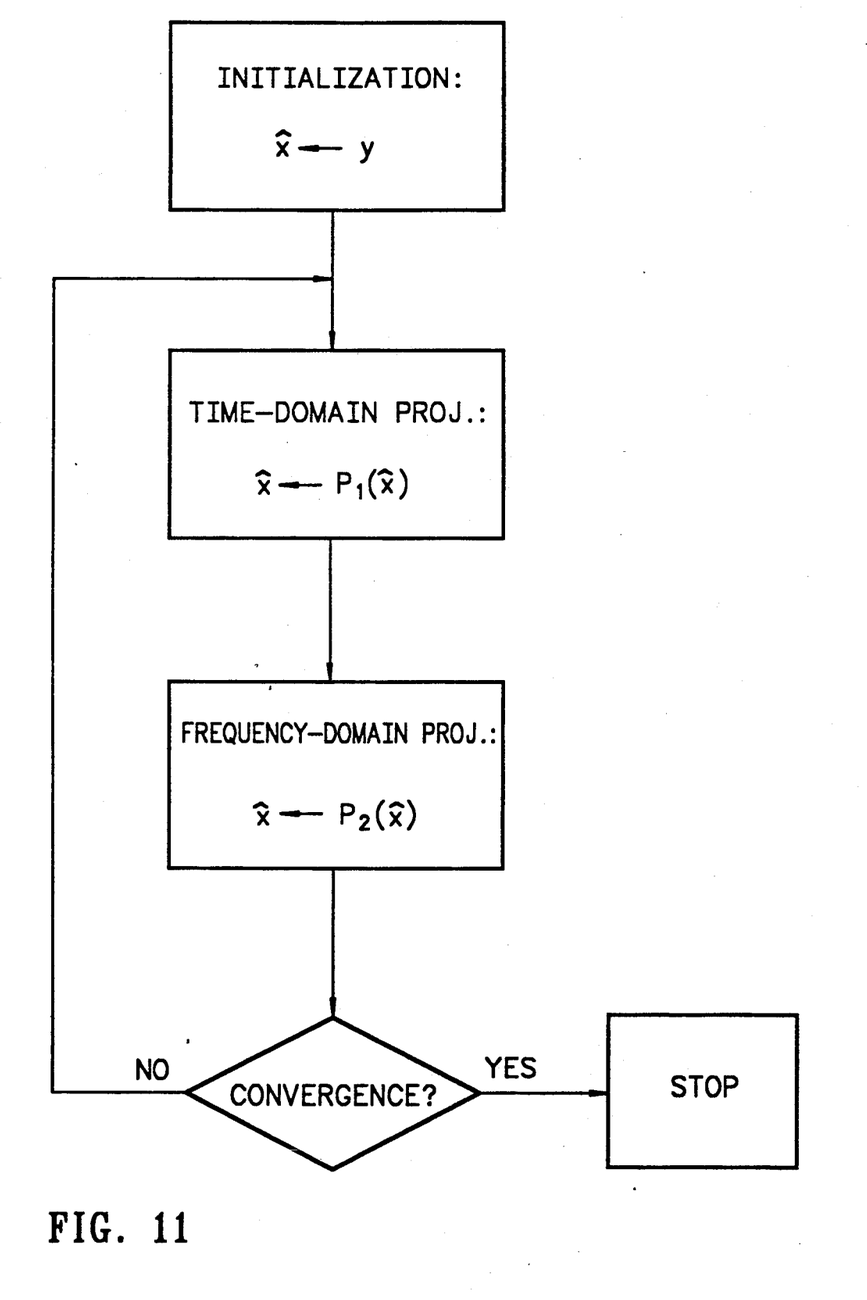

Our use of the POCS technique can be described as follows: For any given binary $\Sigma\Delta$ modulated output signal $y = \{y_0, \ldots y_{N-1}\}$, we define the set $S_1$ of all input signals $x = \{x_0, \ldots, x_{N-1}\}$ that result in y when applied to the modulator. We also define the set $S_2$ of all N-sample signals x that are samples are band-limited infinite-extent sequences with bandwidth equal to the signal bandwidth. To estimate the input signal optimally, we must find a signal $\overline{X}$ in the intersection of $S_1$ and $S_2$. This formulation suggests the POCS algorithm [10]. If we denote the orthogonal projections onto $S_1$ and $S_2$ by $P_1$ and $P_2$, then the POCS algorithm states that an element $\overline{X}$ in the intersection of $S_1$ and $S_2$ can be found from any initial guess $x_0$ by the iteration [10]

$$x_{n+1} = P_2(P_1 x_n), \ n \geq 0, \ \hat{x} = P_1 \hat{x} = P_2 \hat{x} = \lim_{n \to \infty} x_n$$

We use the output signal y as the initial guess. Our use of the POCS technique is illustrated in the flowchart in FIG. 11. We describe particular ways of performing the time-domain and frequency-domain projections in sections 2.1 and 2.2. It is shown in [11] that for the single loop modulator, the invention provides SNR gains of 20-30 dB over conventional linear decoding for typical time-varying inputs.

2.1 Time-Domain Projection

We consider the time-domain projection $P_1$ of a signal x onto the space $S_1$ of sequences that generate a given output signal y. We denote the impulse resonator of the open-loop filter H(z) by $\{h_0, h_1, \ldots\}$; $h_0$ must be zero to avoid delay-free loops. We define the N×N lower-triangular nonsingular Toeplitz matrix $$H = \begin{bmatrix} h_1 & 0 & \ldots & 0 & 0 \\ h_2 & h_1 & \ldots & 0 & 0 \\ \vdots & & & & \vdots \\ h_{N-1} & h_{N-2} & \ldots & h_1 & 0 \\ h_N & h_{N-1} & \ldots & h_2 & h_1 \end{bmatrix} \quad (21)$$

For an Mth order modulator, we define an (M+1)-dimensional state vector s, which we assume to be known in this section. We also define an N×(M+1) zero-input response matrix Z so that if the filter H(z) is driven open-loop with initial state s and zero input over N samples, the filter output is Zs. We can then write the quantizer input vector $u = \{u_0, u_1, \ldots, u_{N-1}\}$ as $$u = I(x-y) + Zs$$

The signs of the quantizer inputs $Q(u_n)$ provide a series on bound linear combinations of sample value x. If we define an N×N diagonal matrix $Q = -\text{diag}(y_1, y_2, \ldots y_N)$, the bounds imposed by the quantizer outputs are $$QHx \leq Q(Hy - Zs) \quad (22)$$

where the inequality sign is to be taken coordinate-wise. It is easily shown that the set $S_1$ of signals satisfying (22) is convex. We adopt the 2-norms as our performance and projection metric. Projecting onto $S_1$ in the 2-norm is equivalent to finding the signal that satisfies (22) and minimizes the distance $$d_1^2 = \|\hat{x} - x\|_2^2 \quad (22)$$

Equations (22) and (23) are a linearly constrained Quadratic Programming (QP) problem which can be solved with techniques available in the literature [12].

In practice, sample sizes N on the order of thousands are desirable to increase the accuracy of the band limitation step. Because of the large computational complexity of the QP problem, we propose an approximation to $P_1$ which takes advantage of the fact that H is lower triangular. The idea is to solve a number of L-dimensional QP problems (L<N) rather than a single N-dimensional one, by dividing the signal x into L-sample QP sub-blocks. In the simplest set-up, the sub-blocks are not overlapping. The small QP problems are solved in chronological order, and no sub-block is allowed to change the estimates of previous sub-blocks. The problem with this set-up is that large changes tend to be necessary at the beginning of each sub-block because of bound violations at the beginning of the sub-block, and the fact that each bound violation must be corrected using only samples before the violation. In our preferred set-up, the sub-blocks are partially overlapping, and thus the optimization of each sub-block takes into account a portion of the sub-block immediately following it.

2.2 Frequency-Domain Projection

In this section we consider the frequency-domain projection $P_2$ of a signal $x = \{x_0, \ldots x_{N-1}\}$ onto the set $S_2$ of signals that are samples of infinite-extent band-limited sequences. This projection raises some questions about band limitation that are discussed in [13] and summarized below.

Two standard techniques for band limitation are the Discrete Fourier Transform (DFT) and linear filtering. However, the DFT is only accurate when the signal frequencies are bin frequencies for the DFT. Windowing can be used to suppress spectral leakage, but has the effect of smearing the signal spectrum [13]. Linear filtering for moderate-length block-oriented processing has two disadvantages: Large edge effects resulting from padding blocks with zeros, and finite-ripple baseband transfer function resulting in signal frequency errors.

Our preferred, general technique for band-limitation is described in [13] and is related to known algorithms for band-limited extrapolation [14]. The technique is based on the SVD of an N×N symmetric Toeplitz matrix L of samples of the impulse response of an ideal low-pass filter, $l_{mn} = \sin[\sigma(m-n)]/[\pi(m-n)]$ where $\sigma = 1/\text{OSR}$. The SVD leads to the truncated Discrete Prolate Spheroidal Sequences (DPSSs) of N-dimensional vectors $\{u_1, \ldots, u_N\}$, which have been studied extensively by Slepian [15] and others. The truncated DPSSs form an orthonormal basis of $R^N$. About $r = N/\text{OSR}$ of the singular values of L are close to 1k, while the remaining ones are close to 0. The truncated DPSSs for singular values close to 1 and 0 are analogous to the baseband and HF complex exponential basis functions, respectively, of the DFT[13]. Our SVD-based algorithm projects signals onto the space spanned by the "baseband" DPSSs, $$\hat{x} = \sum_{n=1}^{r} (x^T u_n) \cdot u_n \quad (24)$$

The projection is in the sense of the 2-norm, and the space is linear and thus convex. The SVD only needs to be done once, and can be implemented efficiently using the Lanczos algorithm [16] and exploiting the Toeplitz form of L. The computation of the projection (24) is $O(N^2/\text{OSR})$ and is found to be comparable in speed to an FFT band-limitation for a sample size of 4096.

5 Conclusions

We have introduced a general technique for optimal decoding of the output of ideal ΣΔ encoders, under the assumptions of constant input and known initial integrator states. The technique is based on deriving a succession of upper and lower bounds on the input interval generating a given output sequence. The optimal decoder is nonlinear, as might be expected from the nonlinear nature of the encoder. Our results indicate that under ideal circumstances, substantial improvements in SNR and worst-case error can be achieved; these results are summarized in Table 1. The improvements can be exploited as enhanced performance at the same data acquisition time, or alternatively, as substantial reductions in data acquisition time for the same performance. We have also presented simulation results for performance in the presence of various circuit imperfections; these results are summarized in Table 2. It is interesting to compare the sensitivities of the zoomers for the encoder structures considered. In general, the single loop zoomer is the least sensitive. The double loop and two-stage zoomers both achieve better trade-offs with oversampling ratio than does the single loop zoomer, but they are also more sensitive to non-idealities. The ideal performance of the double loop and two-stage zoomers is roughly comparable, but it is seen that in general, the two-stage zoomer is about 2-5 times more sensitive towards circuit imperfections. Future work will be directed towards implementing a working prototype of the zoomer algorithm.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. In a data acquisition device having a Sigma Delta modulator with an unknown constant analog input and a N-bit binary digital output signal, decoding apparatus comprising
    means for converting said binary digital output signal into a digital approximation of said analog input signal,
    first and second register means for storing data corresponding to upper and lower bounds of said unknown constant analog input signal,
    means for calculating the upper or lower bound of said constant analog signal for each of said N bits and for updating said register means accordingly, and
    means for outputting the average of said register means as the digital approximation of said analog input signal.

2. The apparatus as in claim 1 wherein said modulator is a single loop modulator.

3. The apparatus as in claim 1 wherein said modulator is a double loop modulator.

4. The apparatus as in claim 1 wherein said modulator is a multi-stage modulator.

5. The apparatus as in claim 1 where said modulator is an interpolative modulator.

6. In a data acquisition device having a Sigma Delta modulator with an unknown time varying N-sample analog input signal and an N-bit binary digital output signal, apparatus for converting said binary digital output signal into a digital approximation of said analog input signal, said apparatus comprising
    N register means,
    means for maintaining said N register means corresponding to estimates of each of said N analog input samples,
    means for storing said N-bit digital output signal as an initial estimate stored in said register means,
    means for iteratively improving upon the estimate stored in said register means by alternating between two operations, namely one operation in which the current estimate stored in said register means is band-limited and subsequently stored in said register means, and the other operation in which the current estimate stored in said register means is modified to satisfy bounds so that the estimate generates said N-bit binary digital output signal as applied to said Sigma Delta modulator.

7. The apparatus as in claim 6 wherein said modulator is a single loop modulator.

8. The apparatus as in claim 6 wherein said modulator is a double loop modulator.

9. The apparatus as in claim 6 wherein said modulator is a multi-stage modulator.

10. The apparatus as in claim 6 where said modulator is an interpolative modulator.

11. In a data acquisition device having a Sigma Delta modulator with an unknown constant analog input and an N-bit binary digital output signal and first and second registers, the method comprising the steps of
    converting said binary digital output signal into a digital approximation of said analog input signal,
    storing in said first and second register data corresponding to upper and lower bounds of said unknown constant analog input signal,
    calculating the upper or lower bound of said constant analog signal for each of said N bits and updating said register means accordingly, and
    outputting the average of said registers as the digital approximation of said analog input signal.

12. In a data acquisition device having a Sigma Delta modulator with an unknown time vary N-sample analog input signal, an N-bit binary digital output signal and N registers, a method for converting said binary digital output signal into a digital approximation of said analog input signal, comprising the steps of
    maintaining said N register corresponding to estimates of each of said N analog input samples,
    storing said N-bit digital output signal as an initial estimate stored in said register means,
    iteratively improving upon the estimate stored in said registers by alternating between two operations, namely one operation in which the current estimate stored in said registers is band-limited and subsequently stored in said registers, and one operation in which the current estimate stored in said register means is modified to satisfy founds so that the estimate generates said N-bit binary digital output signal as applied to said Sigma Delta modulator.

* * * * *